Oct. 21, 1969 I. M. GOTTLIEB 3,474,409

LOOP OSCILLATOR FOR A VEHICLE PRESENCE DETECTOR

Filed June 30, 1965

INVENTOR.
IRVING M. GOTTLIEB
BY
Edward A. Robinson
ATTORNEY

United States Patent Office 3,474,409

Patented Oct. 21, 1969

3,474,409
LOOP OSCILLATOR FOR A VEHICLE PRESENCE DETECTOR

Irving M. Gottlieb, Menlo Park, Calif., assignor to Singer-General Precision, Inc., a corporation of Delaware Filed June 30, 1965, Ser. No. 468,451
Int. Cl. G08g *1/01*
U.S. Cl. 340—38 1 Claim

ABSTRACT OF THE DISCLOSURE

The disclosed embodiment of the present invention is a vehicle presence detector which includes a loop positioned along a vehicular path and having an inductance which is variable in response to the proximity of a vehicle body. The loop forms the inductive element of a tuned circuit which is connected to a relaxation oscillator. As the resonant frequency of the tuned circuit changes with the approach of a vehicle in close proximity thereto, the output frequency of the relaxation oscillator changes accordingly. A pulse output signal from the oscillator is connected to a blocking oscillator or monostable multivibrator which generates pulses of constant time duration. A direct current voltage proportional to the output frequency of the relaxation oscillator is generated by integrating the pulses of constant time duration.

Figures 1, 2:
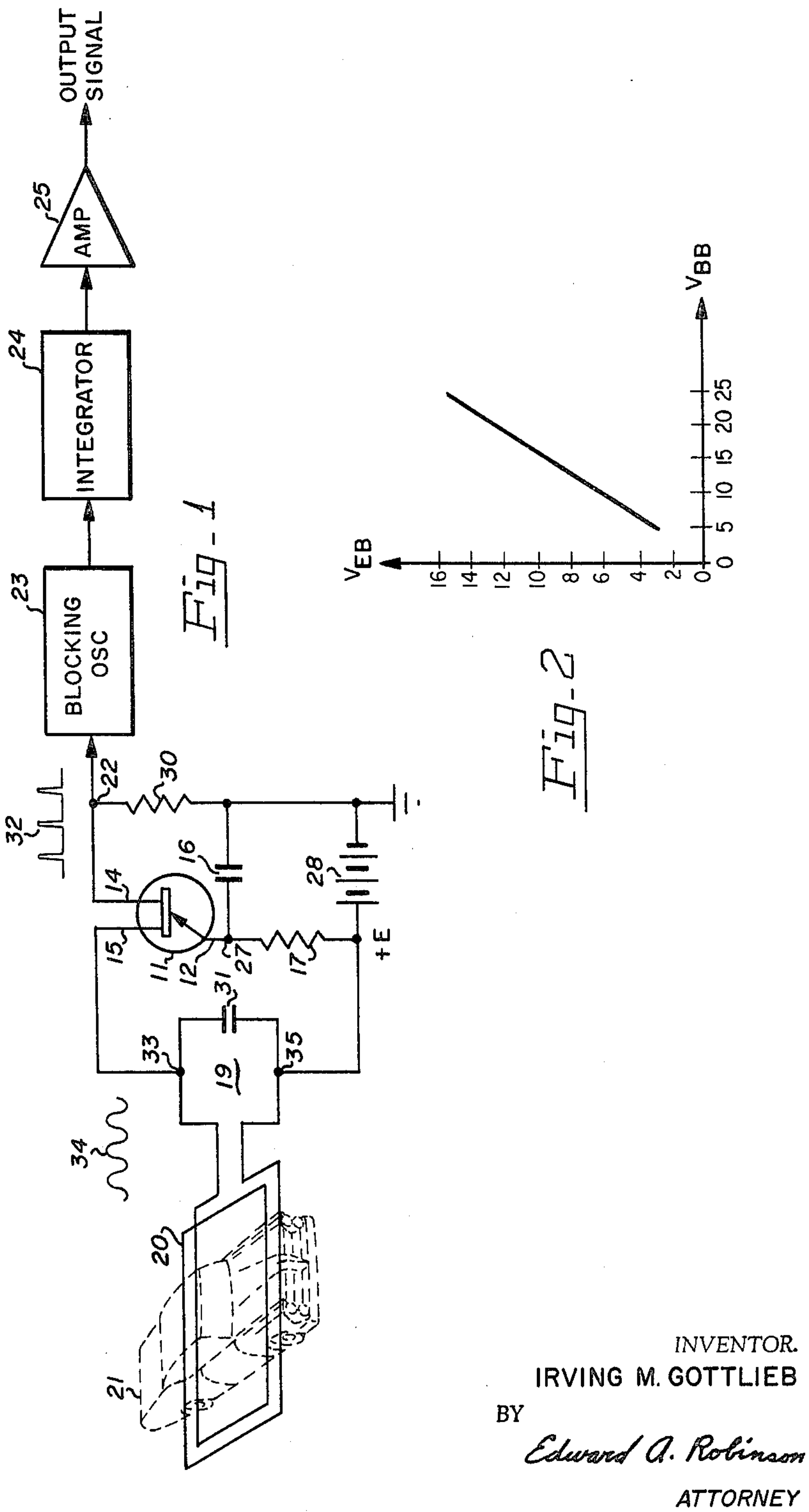

This invention relates to a system for detecting the presence of vehicles, and more particularly, this invention concerns an oscillator circuit for a vehicle presence detector system wherein the frequency of an output signal is varied by the presence of a vehicle over an inductive loop.

Inductive loop vehicle presence detecting systems have been disclosed in a Patent No. 3,164,802 granted to Robert A. Kleist and John Scarbrough on Jan. 5, 1965 entitled "Inductive Loop Vehicle Presence Detector." Further inductive loop presence detector systems are disclosed by two co-pending patent applications of Martin J. Prucha which are assigned to the same assignee as the instant application. One co-pending patent application is entitled "Vehicle Presence Detector," Ser. No. 129,342 and filed Aug. 4, 1961; the other patent application is entitled "Inductive Loop Vehicle Presence Detector" filed Feb. 12, 1962, Ser. No. 172,620. Each of these patent applications discloses arrangements wherein inductive loops are positioned beneath the rails of a railroad track or embedded in the paving of a highway or the like for sensing the presence of vehicles passing thereover. The inductive loops are electrically connected as a part of a resonant circuit of an oscillator such that the metallic mass of a railroad or highway vehicle moving over the loop will vary the inductive value thereof and will thereby vary the frequency of the oscillator. Further circuitry will sense a shift in the oscillator frequency to close a relay and actuate traffic control devices, crossing gate signals, interlocking circuits for protection of railroad switches, traffic counters and the like.

It is an object of this invention to provide an improved oscillator circuit which will be economical to manufacture and which will include an inductive loop for controlling the frequency of the oscillator in accordance with the passage of vehicles thereover.

It is a further object of this invention to provide a vehicle detecting loop oscillator which is substantially a relaxation circuit combined with a resonant circuit including an inductive loop, and more particularly, it is an object to provide a coupling arrangement between a relaxation circuit and a resonant circuit such that a signal generated by the relaxation circuit will sustain oscillatory currents in the resonant circuit, and further providing that the oscillatory currents from the resonant circuit will control the frequency of the signal generated by the relaxation circuit.

Another object of this invention is to provide an oscillator having a unijunction transistor or double-base diode wherein a first portion of the unijunction transistor constitutes a discharge path for a relaxation circuit and wherein another portion of the unijunction transistor is coupled to a resonant circuit for excitation thereof and for controlling the frequency of the relaxation circuit.

Numerous other objects and advantages will be apparent throughout the progress of the specification which follows. The accompanying drawings illustrate a certain exemplary embodiment of the invention and the views therein are as follows:

FIGURE 1 is a circuit diagram of a vehicle presence detector system particularly illustrating the oscillator of this invention; and FIGURE 2 is a graphical representation of conduction characteristics of a unijunction transistor or double-base diode which is used in the oscillator illustrated by FIGURE 1.

Briefly stated, according to a preferred embodiment of this invention, an oscillator circuit includes a unijunction transistor 11 having an emitter electrode 12 and two base electrodes 14 and 15. The unijunction transistor 11 together with a capacitor 16 and a resistor 17 constitute a relaxation circuit. The capacitor 16 charges gradually from current flow through the resistor 17 until the unijunction transistor becomes conductive at which time the capacitor 16 is abruptly discharged. A resonant or tank circuit 19 includes an inductive loop 20 positioned in a traffic lane for vehicles. The resonant circuit 19 is shock excited from the relaxation oscillator by pulses passed by the unijunction transistor 11. Current flow will flow in the tank circuit 19 at the resonant frequency thereof, and will bias the second base electrode 15 of the unijunction transistor whereby conduction times of the unijunction transistor will be determined by the resonant current to control the discharge times of the relaxation circuit and thereby to control the relaxation or output signal frequency.

FIGURE 1 shows a vehicle presence detector system wherein the inductive loop 20 is positioned beneath a path for a vehicle 21 such as a railroad track or the traffic lane of a street. The loop oscillator generates an output signal on a lead 22 which may be a train of pulses from the relaxation circuit associated with the unijunction transistor 11. When the vehicle 21 moves over the loop 20, the inductive value of the loop decreases somewhat and the resonant frequency of the tank circuit 19 is increased. Consequently, the pulse repetition rate of the signal appearing on the lead 22 will also increase. A blocking oscillator or monostable multivibrator 23 generates pulses having a constant time duration. As the frequency of the oscillator varies, the blocking oscillator generates constant width pulses which recur at a varying rate such that an asymmetrical wave is generated and passed to an integrator circuit 24. An integrator 24 receives the pulse train from the blocking oscillator 23 and generates a direct potential output signal having a signal level determined by the frequency. A direct current amplifier 25 will amplify the signal level from the integrator circuit 24 to provide an output signal which may be utilized for driving a relay or other device (not shown). This presence detector system is more completely described in a co-pending patent application of this inventor entitled "Inductive Loop Presence Detector," filed on an even date herewith, now U.S. Patent 3,375,493.

The loop oscillator of this invention comprises a relaxation circuit including the capacitor 16, the resistor 17 and the unijuction transistor 11. During intervals when the unijunction transistor 11 is non-conductive, the capacitor 16 accumulates charge through the resistor 17. During these intervals the potential at a point 27 increases gradually as the capacitor 16 charges by current flow through the resistor 17 from a reference voltage +E. In an exemplary embodiment of this invention the capacitor 16 was of a value of .001 microfarad; the resistor 17 was of a value of 30,000 ohms; and the reference voltage +E was of a value of +12 volts above ground potential which may be supplied by a battery 28.

A unijunction transistor or double-base diode has a breakdown or firing characteristic such that the voltage appearing at the point 27 and the emitter electrode 12, will gradually rise until the critical breakdown value or emitter firing voltage of the unijunction transistor is reached causing conduction through the unijuction transistor. When the unijunction transistor 11 conducts, the capacitor 16 is abruptly discharged through the transistor 11 and a low value load resistor 30. In the exemplary embodiment of this invention, the resistor 30 was of a value of 600 ohms which is very low as compared to the value of the charging resistor 17. It may be appreciated that the relaxation oscillator including the capacitor 16 and the resistor 17 and 30 together with the emitter base circuit 12–14 of the unijuction transistor 11 will be operative and will be free running even if a simple impedance element were to replace the resonant circuit 19. The resonant circuit 19 is provided to control the frequency of the relaxation circuit, and of the output signal.

The resonant circuit 19 includes the inductive loop 20 and a capacitor 31 connected in parallel. The resonant circuit 19 is connected between the second base electrode 15 of the unijunction transistor and the reference potential +E. The relaxation oscillator will normally generate an output signal as shown at 32 on the first base electrode 14, and (without the resonant circuit 19) a similar output signal with reversed polarity would appear at the second base electrode 15. The signal from the second base electrode 15 is impressed upon the tank circuit 19 and will pump energy into that circuit. This energy excites the tank circuits and currents will flow therein at the resonant frequency whereby a sine wave of voltage will appear at a point 33 as shown by the wave form 34. The sine wave of voltage is applied to the second base electrode 15 of the unijunction transistor and provides a fluctuating bias to the unijunction transistor to control the times of emitter firing and of discharge of the capacitor 16.

The resonant frequency of the tank circuit 19 may be either the fundamental or a higher harmonic of the normal free running frequency of the relaxation oscillator. For the purpose of this patent application, the fundamental frequency will be deemed to be the first harmonic of the relaxation frequency. Thus, when the resonant frequency is defined as a harmonic of the relaxation frequency, the possibility of the first harmonic or fundamental frequency is not excluded.

A unijunction transistor or double-base diode is a semiconductor device with a single emitter terminal and with symmetrical base terminals. As the emitter electrode is biased more positively, the device will remain in a state of non-conduction until the bias approaches a critical threshold level known as the emitter firing voltage, $V_{EB}$. The emitter firing voltage is not a constant value, but is a function of a voltage impressed across the two base electrodes known as the inter-base voltage, $V_{EB}$. As shown in FIGURE 2, the relationship between the inter-base voltage and the emitter firing voltage is substantially linear with the emitter firing voltage, $V_{EB}$, increasing proportionally as the inter-base voltage $V_{BB}$ increases. A more complete description of the operation of this device appears in a textbook entitled "Fundamentals of Transistor Physics" by Irving Gottlieb, this inventor, published by J. F. Rider, Inc., New York, 1960, with specific reference to the description appearing in pages 118 through 120.

As has been previously stated, the sine wave 34 appearing across the resonant circuit 19 serves to bias the second base electrode 15. The resonant circuit 19 is effectively coupled between the two base electrodes since the impedance of the direct current power source 28 and the low value resistor 30 is of little consequence. Thus, from FIGURE 1, it may be appreciated that one terminal of the resonant circuit 33 is directly connected to one of the base electrodes 15 and the other terminal 35 is coupled to the other base electrode 14 via the negligible impedance of the voltage source 28 and the low valued resistor 30. The resonant circuit 19 is thereby effectively across the base electrodes of the unijuction transistor 11. It may be further appreciated that the alternating voltage appearing across the tank circuit 19 is added to the direct voltage, +E, from the source 28 to provide a fluctuating bias across the two base electrodes 14 and 15.

From the curve of FIGURE 2 it may be noted that the emitter firing voltage required to drive the unijunction transistor into conduction will be less when the inter-base voltage is a minimum. The sine wave voltage 34 added to the direct voltage +E furnished by the source 28 provides a bias voltage with minimum values timed with the resonant frequency; and therefore, the discharge times of the capacitor 16 will occur when the wave 34 at these times of minimum bias. At the beginning of each cycle the capacitor 16 accumulates charge slowly through the resistor 17 gradually increasing the potential of the emitter electrode 12. The voltage across the resonant circuit 19 varies sinusoidally, and the instant of firing of the unijuction transistor 11 will occur after the first, the second, or more full cycles of the sine wave 34.

An oscillator of this type was built and satisfactorily tested when the normal relaxation frequency was of the order of 60 kilocycles and the resonant frequency was the second harmonic or 120 kilocycles. This circuit was also built and tested using a relaxation frequency of the order of 70 kilocycles and a resonant frequency of the first harmonic which is likewise 70 kilocyles. In the first case, the resonant frequency was twice the relaxation frequency, while in the second case the resonant frequency and relaxation frequency were equal to each other.

Obviously, the resonant frequency of the tank circuit 19 depends upon the values of the inductance of the loop 20 and the capacitance of the element 31. In the exemplary circuit, the inductance of the loop was of the order of 90 microhenries and the capacitance of the element 31 was of the order of .11 microfarad. When a vehicle 21 moves into spaced relation over the loop 20, the inductive value thereof decreases by approximately 5% of its normal value. Therefore, the inductance of the loop may decrease from approximately 90 microhenries to approximately 85 microhenries when an automobile or other vehicle moves thereover. Obviously, the resonant frequency of the circuit 19 will vary when a vehicle enters the magnetic field of the loop 20. Since the loop inductance decreases in value, the resonant frequency, the sine wave 34, will increase correspondingly and the frequency of the relaxation oscillator will be increased. Thus, the variation in the loop inductance controls the resonant frequency which likewise controls the relaxation frequency and the frequency of the output signal.

The oscillator of this invention enjoys an advantage in using a relaxation circuit with a unijunction transistor which has a normal operating range of 10 to 100 kilocycles; while the tank circuit and the currents through the inductive loop have a much greater range of available frequencies since the higher harmonics of the relaxation frequency are available in addition to the first harmonic. Indeed, it is feasible to increase the resonant frequency for excitation of the inductive loop to values up to and exceeding 200 kilocycles while operating the relaxation oscillator at a frequency of the order of 50 to 60 kilocycles. In other instances, certain traffic installations require that an inductive loop be installed under a traffic lane at a considerable distance from the presence detector unit which may be located in a control box somewhat remote from a traffic intersection. In such an installation having an extended lead-in (up to 750 feet), the losses and the capacitive effect of the lead-in may seriously impair the sensitivity of the presence detector circuit. In such an installation, it has been deemed more desirable to use a lower loop frequency to minimize the adverse effects of the long lead-in. It is possible with this presence detector unit to operate the loop at a frequency at the first harmonic of the relaxation circuit and to achieve loop frequency of 40 to 60 kilocycles. Therefore, the vehicle presence detector system of this invention provides a much wider range of available loop frequencies than any presence detector system heretofore known.

Changes may be made in the form, construction and arrangement of the parts without departing from the spirit of the invention or sacrificing any of its advantages, and the right is hereby reserved to make all such changes as fall fairly within the scope of the following claim.

The invention is claimed as follows:

1. A system for sensing the presence of vehicles and the like comprising a relaxation oscillator having a predetermined time constant, a resonant circuit formed of an inductance having a value which is variable in response to the presence of a vehicle and the like, means connecting said resonant circuit to said relaxation oscillator for exciting said resonant circuit at a frequency determined by the value of said inductance and for biasing said relaxation oscillator with a signal having a frequency equal to the resonant frequency of said resonant circuit, output circuit means for said relaxation oscillator providing a pulse output signal having a frequency determined by the resonant frequency of said resonant circuit, and circuit means connected to an output of said relaxation oscillator for generating a signal having an amplitude equal to the frequency of the signal at the output of said relaxation oscillator.

References Cited

UNITED STATES PATENTS

| | | | |
|---|---|---|---|
| 3,142,024 | 7/1964 | Mordwinkin | 331—111 |
| 3,312,935 | 4/1967 | Brothman. | |
| 3,164,802 | 1/1965 | Kleist. | |
| 3,205,352 | 9/1965 | Prucha. | |
| 3,266,028 | 8/1966 | Taylor. | |
| 3,375,493 | 3/1968 | Gottlieb. | |

THOMAS B. HABECKER, Primary Examiner

U.S. Cl. X.R.

331—111